United States Patent
Towne et al.

(10) Patent No.: US 10,797,851 B2
(45) Date of Patent: Oct. 6, 2020

(54) DUAL EDGE SYNCHRONIZATION OF ANALOG INPUT TO REDUCE SWITCH POINT JITTER

(71) Applicant: Allegro MicroSystems, LLC, Manchester, NH (US)

(72) Inventors: Jay M. Towne, Bow, NH (US); Steven E. Snyder, New Boston, NH (US); Steven Ricco, Concord, NH (US); Matthew Nealon, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 354 days.

(21) Appl. No.: 15/966,572

(22) Filed: Apr. 30, 2018

(65) Prior Publication Data

US 2019/0334692 A1    Oct. 31, 2019

(51) Int. Cl.
| | |
|---|---|
| *H04L 7/00* | (2006.01) |
| *G01D 18/00* | (2006.01) |
| *G01J 1/44* | (2006.01) |
| *G01K 15/00* | (2006.01) |
| *G01R 35/00* | (2006.01) |

(52) U.S. Cl.
CPC ......... *H04L 7/0016* (2013.01); *G01D 18/006* (2013.01); *G01J 1/44* (2013.01); *G01K 15/005* (2013.01); *G01R 35/005* (2013.01); *H04L 7/0008* (2013.01); *G01J 2001/444* (2013.01)

(58) Field of Classification Search
CPC ... H04L 7/0016; H04L 7/0008; G01D 18/006; G01J 1/44; G01J 2001/444; G01K 15/005; G01R 35/005
See application file for complete search history.

(56) References Cited

U.S. PATENT DOCUMENTS

| | | | |
|---|---|---|---|
| 6,711,220 B1* | 3/2004 | Yoshida | H04L 7/0338 375/354 |
| 2006/0192592 A1* | 8/2006 | Inderst | H04L 7/0008 327/24 |
| 2010/0225308 A1* | 9/2010 | Kurumado | G01D 5/2451 324/207.25 |

* cited by examiner

*Primary Examiner* — Manuel L Barbee
(74) *Attorney, Agent, or Firm* — Daly, Crowley, Mofford & Durkee, LLP

(57) ABSTRACT

A method for synchronization of an input signal includes providing the input signal to a first signal path associated with a first clock and to a second signal path associated with a second clock, detecting an edge of the input signal by detecting values of the input signal along the first signal path at a first rising edge of the first clock and at a second rising edge of the first clock, detecting a value of the input signal along the second signal path at an edge of the second clock, and selecting the input signal from the first signal path or from the second signal path according to the detected value of the input signal along the second path when an edge of the input signal along the first path is detected.

23 Claims, 5 Drawing Sheets

DUAL EDGE SYNCHRONIZATION OF ANALOG INPUT TO REDUCE SWITCH POINT JITTER

BACKGROUND

In the field of electronic sensors, many sensors output an asynchronous signal. In sensors detecting target position and/or movement, the asynchronous signal can experience jitter (i.e., undesirable variations in signal transitions relative to a reference that can adversely impact accuracy, for example, when detecting speed and/or position of the target). In systems that output a synchronous signal, there is a further source of jitter caused by the non-zero period of the system clock. Because the output can only transition on a clock edge in a synchronous system, it is advantageous to reduce the clock period to thus reduce the clock period-related jitter. Increasing the clock frequency is not always possible, due to factors such as increased switching current consumption and process limitations.

Further, systems that output a synchronous signal may use a digital controller with two clock domains to reduce clock period-related jitter. However, using a digital control with two clock domains is non-ideal for several reasons, such as the need for multiple scan chains and possible timing issues.

SUMMARY

Described are concepts, systems, and techniques directed toward synchronization of an asynchronous output signal. According to some embodiments, output jitter is reduced by allowing the output to occur on either edge of the system clock, depending on which edge of the system clock occurs first after the asynchronous primary input into the digital controller, coming from the analog circuitry.

Embodiments provide methods and apparatus for dual edge synchronization of an asynchronous input. In one embodiment, a method for synchronization of an input signal comprises providing the input signal to a first signal path associated with a first clock, and to a second signal path associated with a second clock and detecting an edge of the input signal by detecting values of the input signal along the first signal path at a first edge of the first clock and at a second edge of the first clock. The method may further include detecting a value of the input signal along the second signal path at an edge of the second clock and selecting the input signal from the first signal path or from the second signal path according to the detected value of the input signal along the second path when an edge of the input signal along the first path is detected.

The method may further include one or more of the following features taken either alone or in combination: providing the selected one of the input signal from the first signal path or from the second signal path as an output signal synchronized with a closest one of a rising edge or a falling edge of the first clock; wherein the second clock is out of phase with respect to the first clock; wherein the second clock is an inverted version of the first clock; wherein detecting values of the input signal occurs at a predetermined time after providing the input signal to the first and second signal paths, wherein the predetermined time is associated with at least one cycle of the first clock or the second clock; wherein selecting the input signal from the first signal path or from the second signal path occurs at a predetermined time after detecting values of the input signal, wherein the predetermined time is associated with at least one cycle of the first clock or the second clock; wherein selecting the input signal from the first signal path or from the second signal path comprises: determining whether a rising edge of the input signal has been received; wherein selecting the input signal from the first signal path or from the second signal path further comprises: selecting the input signal from the second signal path if the detected value of the input signal along the second signal path is set high when the rising edge of the input signal is received; wherein selecting the input signal from the first signal path or from the second signal path further comprises: selecting the input signal from the first signal path if the detected value of the input signal along the second signal path is set low when the rising edge of the input is received; wherein selecting the input signal from the first signal path or from the second signal path comprises: determining whether a falling edge of the input signal has been received; wherein selecting the input signal from the first signal path or from the second signal path further comprises: selecting the input signal from the first signal path if the detected value of the input signal along the second signal path is set high when a falling edge of the input signal is received; wherein selecting the input signal from the first signal path or from the second signal path further comprises: selecting the input signal from the second signal path if the detected value of the input signal along the second signal path is set low when the falling edge of the input signal is received; wherein the input signal comprises an output signal of at least one or more of a magnetic field sensor, a pressure sensor, a temperature sensor, or a photo-electric sensor.

In another embodiment, an apparatus for synchronization of an asynchronous signal in a sensor comprises a sensing element for generating a sensed signal and a detector responsive to the sensed signal and configured to generate an asynchronous detector output signal. The apparatus may further include a synchronizer responsive to the asynchronous detector output signal and configured to synchronize the asynchronous detector output signal to a selected one of a first edge of at least one clock and a second edge of the at least one clock.

The apparatus may also include one or more of the following features taken either alone or in combination: a first signal path coupled to receive the asynchronous detector output signal and associated with the first clock; a second signal path coupled to receive the asynchronous detector output signal and associated with a second clock; a comparator coupled to the first signal path and to the second signal path and configured to compare values of the detector output signal along the first signal path at a first rising edge of the first clock and at a second rising edge of the first clock and along the second signal path at an edge of the second clock; a multiplexer coupled to an output of the comparator and configured to select the asynchronous detector output signal from the first signal path or from the second signal path according to the comparison by the comparator of the values of the detector output signal along the first and second signal paths; wherein the second clock is out of phase with respect to the first clock; wherein the second clock is an inverted version of the first clock; wherein the multiplexer is further configured to: provide the selected one of the input signal from the first signal path or the second signal path as an output signal of the sensor; wherein the first signal path comprises a plurality of flip-flops, at least two of the plurality of flip-flops arranged in a dual-rank synchronizer; and wherein the second signal path comprises a plurality of flip-flops, at least two of the plurality of flip-flops arranged in a dual-rank synchronizer; wherein the sensing element comprises a magnetic field sensing element responsive to a magnetic field affected by movement of a target and wherein the sensed signal is indicative of movement of the target; wherein the transitions of the asynchronous detector output signal are indicative of a rotation of the target; a back bias magnet to generate the magnetic field, wherein the target comprises a ferromagnetic object; wherein the magnetic field sensing element comprises at least one of a Hall effect element or magnetoresistance element.

In yet another embodiment, an apparatus for synchronization of an asynchronous signal comprises means for comparing values of the asynchronous signal along a first signal path associated with a first clock and along a second signal path associated with a second clock and means for selecting the detector output signal from the first signal path or from the second signal path according to a comparison of the values of the detector output signal along the first and second signal paths.

The apparatus may also include means for providing the selected one of the input signal from the first signal path or from the second signal path as an output signal synchronized with a closest one of a rising edge or a falling edge of the first clock.

BRIEF DESCRIPTION OF THE DRAWINGS

The concepts, structures, and techniques sought to be protected herein may be more fully understood from the following detailed description of the drawings, in which.

Figure 1:
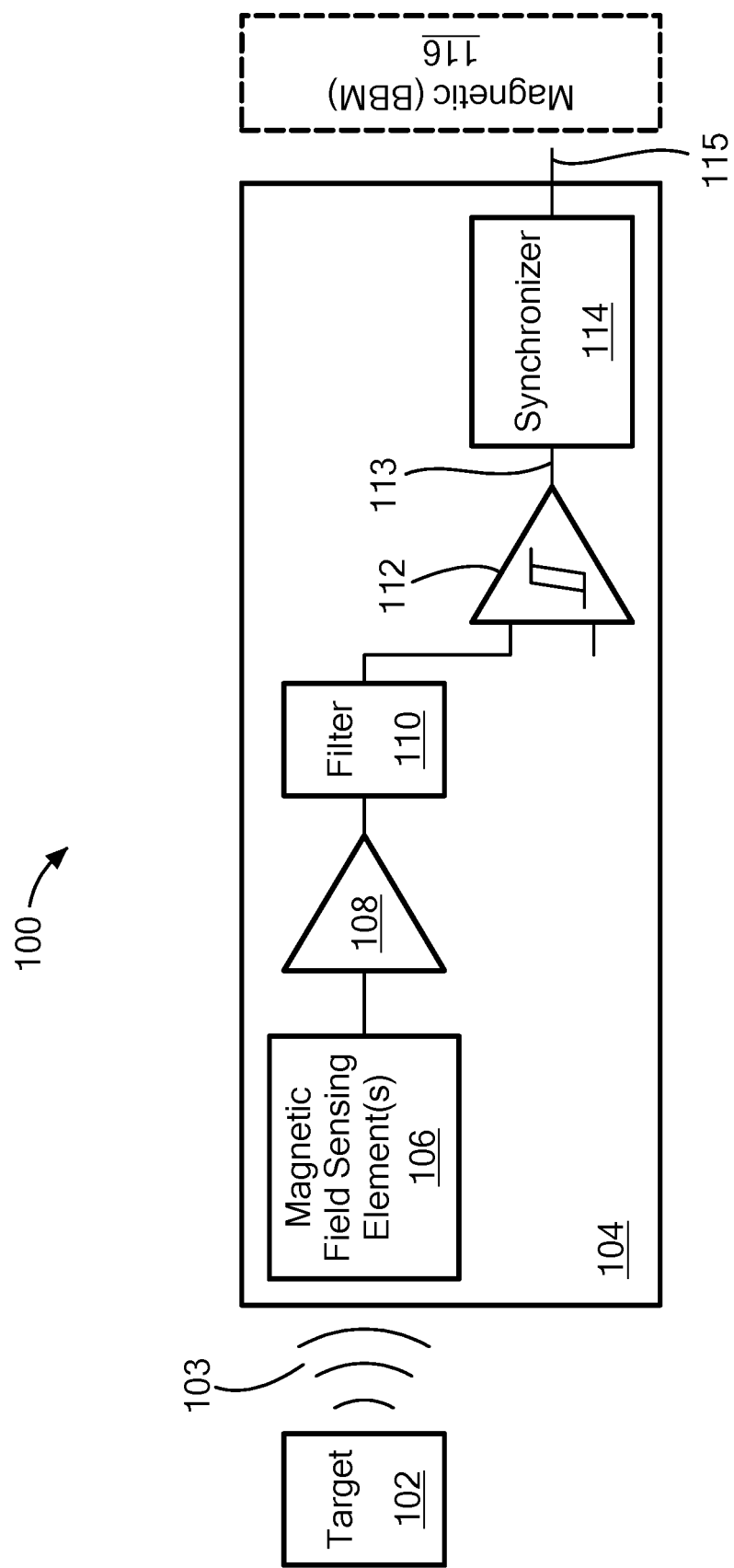
FIG. 1 is a block diagram of a system for dual edge synchronization of analog input to reduce switch point jitter, according to some embodiments.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

In particular, it should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Ferromagnetic objects described herein can have a variety of forms, including, but not limited to, a ring magnet having one or more pole pair, and a gear having one or more gear teeth.

Signals with pulses are described herein as generated by a magnetic field sensor. In some embodiments, the signals are provided on a communication link to an external processor, for example, a CPU within an automobile, to further process the pulses.

As used herein, the term "pulse" is used to describe a signal that begins at a first level or state, transitions rapidly to a second level or state different than the first level and returns rapidly to the first level.

FIG. 1 illustrates a block diagram of a system 100 for dual edge synchronization of an analog input to reduce switch point jitter, according to some embodiments. System 100 includes magnetic field sensor 104 for sensing a magnetic field 103 affected by movement of a target 102. In some embodiments, magnetic field sensor 104 encompasses magnetic field sensing element 106, a detector comprising operational amplifier 108, filter 110, and comparator 112, and synchronizer 114. It should be appreciated that although the illustrative embodiment of FIG. 1 shows one magnetic field sensing element 106, other embodiments of system 100 may include two or more magnetic field sensing elements 106.

According to some embodiments, target 102 may comprise a magnetic object (e.g. a hard-ferromagnetic material to generate magnetic field 103, that is sensed by magnetic field sensor 104. In other embodiments, target 102 may comprise a ferromagnetic object (e.g. a soft ferromagnetic material) that alters the magnetic field produced a magnet proximate to magnetic sensor 104, such as back bias magnet 116, as the position of target 102 changes relative to back bias magnet 116. In either case, the target 102 may take various forms, such as a ring magnet with a plurality of magnetic poles or a gear having a plurality of teeth.

Magnetic field sensing element 106 senses magnetic field 103 and provides a signal representative of the sensed magnetic field ("magnetic field signal") to the detector which comprises operational amplifier 108, filter 110, and comparator 112. Operational amplifier 108 receives the signal produced by magnetic field sensing element 106 and generates an amplified magnetic field signal. It should be noted that although in the illustrative embodiment of FIG. 1 only one operational amplifier 108 is shown, in other embodiments, magnetic field sensor 104 may include two or more operational amplifiers 108.

The detector also includes a filter 110 that receives the amplified magnetic field signal from operational amplifier 108. Filter 110 may comprise adaptive filters, low-pass filters, high-pass filters, band-pass filters, or any combination thereof—to name a few examples. Filter 110 produces a filtered magnetic field signal based upon the amplified magnetic field signal.

The detector further includes a comparator 112 that receives the filtered magnetic field signal from filter 110. According to some embodiments, comparator 112 may further receive a threshold signal or value. Comparator 112 may generate an output signal 113 (referred to herein alternatively as a detector output signal) by comparing the filtered magnetic field signal to the threshold value. In some embodiments, comparison of the magnetic field signal to the threshold yields a pulse train having transitions each time the magnetic field signal crosses the threshold. Comparator 112 may have hysteresis. A frequency of occurrence of the pulses and/or transitions can be indicative of a speed of motion of the target 102. In some embodiments, the signal 113 is asynchronous, and may experience jitter.

The asynchronous signal 113 is provided to synchronizer 114. Synchronizer 114 is configured to synchronize the asynchronous signal 113 according to a first edge of at least one clock and a second edge of at least one clock. For example, synchronizer 114 may synchronize the signal 113 according to a rising edge of a first clock and a rising edge of a second clock, a rising edge of a first clock and a falling edge of a second clock, a rising edge of a first clock and a falling edge of a first clock, or any combination thereof—to name a few examples. As discussed in further detail below with reference to FIG. 2, synchronizer 114 synchronizes the asynchronous signal 113 to one or more clock signals, inverse clock signals, average clock signals, weighted clock signals, or any combination thereof—to name a few examples. Once the signal 113 is synchronized by synchronizer 114, a synchronized signal 115 is output by synchronizer 114.

The synchronized sensor output signal 115 can be provided to circuits and systems (internal or external to the sensor 114, not shown) for further processing. For example, in an automotive application, the signal 115 can be provide to an engine control unit (ECU) for detection of gear or wheel speed, direction and/or vibration.

Figure 2:
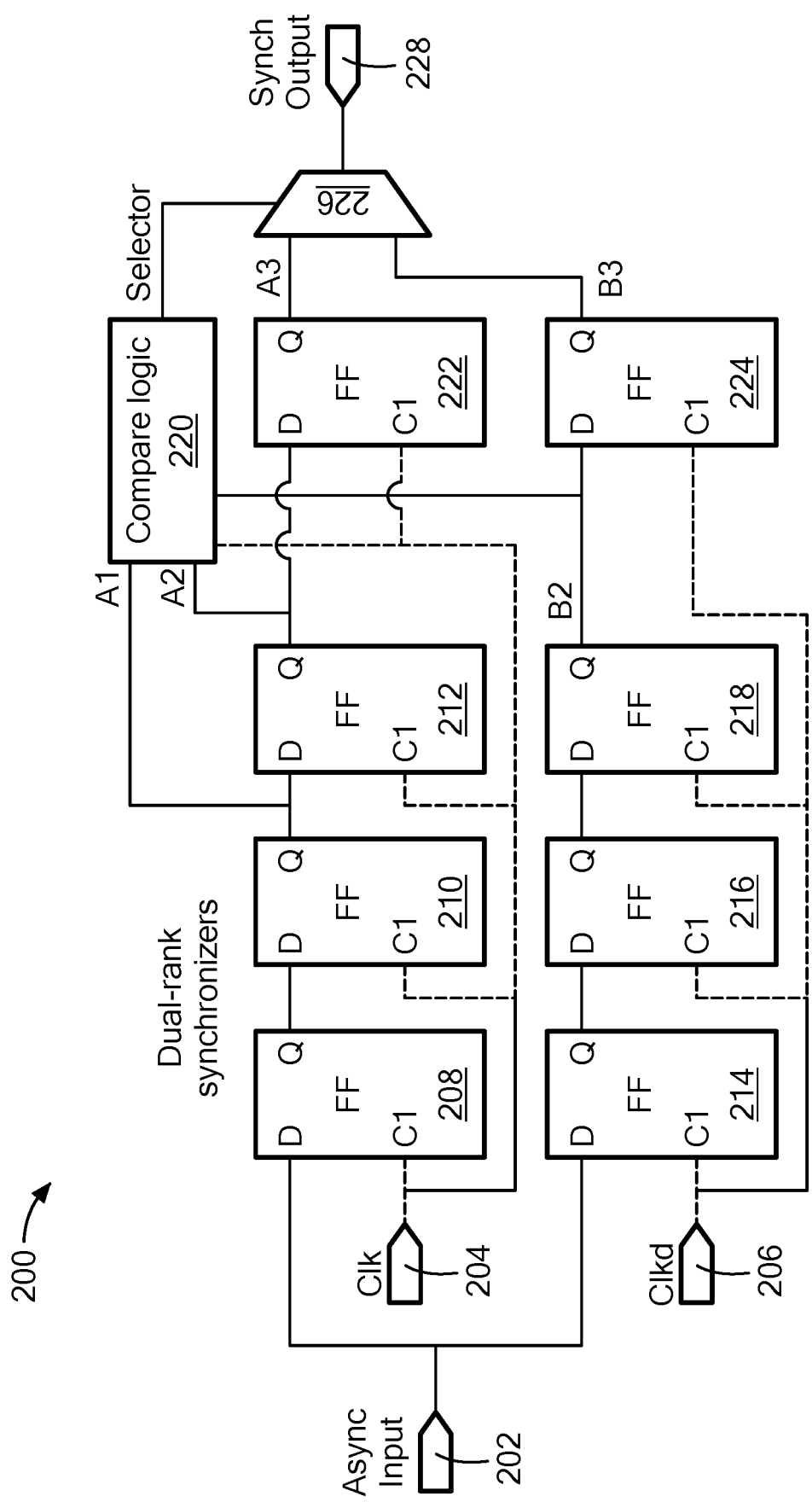
FIG. 2 is a simplified schematic of an illustrative embodiment of a synchronizer, according to some embodiments.

FIG. 2 is a simplified schematic of an illustrative embodiment of synchronizer 200 within system 100, according to some embodiments. Synchronizer 200 includes a first signal path including one or more flip-flops 208-212 and 222 (e.g. set-reset (SR), data (D), toggle (T), JK, or any combination thereof—to name a few examples) arranged in series, a second signal path including one or more flip-flops 214-218 and 224 (e.g. SR, D, T, JK, or any combination thereof—to name a few examples) arranged in series, compare logic 220, and multiplexer 226. Synchronizer 200 is configured to receive asynchronous input 202 (such as, for example, a detector output signal, as discussed above) at both the first and second signal paths, a first clock signal 204 at the first signal path, and a second clock signal 206 at the second signal path, wherein the second clock signal 206 is out of phase with the first clock signal 204. According to some embodiments, asynchronous input 202 may comprise the output signal of a sensor, e.g. asynchronous input 202 may comprise the output signal of a transducer (i.e. an element configured to convert a first form of energy to a second form of energy such as a Hall element, GMR yoke, photo-diode, or any combination thereof), magnetic field sensor, pressure sensor, temperature sensor, photo-electric sensor, laser sensor, or any combination thereof—to name a few examples.

While in the illustrative embodiment of FIG. 2 synchronizer 200 comprises a first signal path associated with a first clock signal 204 and a second signal path associated with a second clock signal 206, in other embodiments synchronizer 200 may comprises three or more signal paths associated with three or more clock signals that may be out of phase with one another by any number of degree. In some embodiments, the number of clock signals may be equal to the number of signal paths (as in the illustrative embodiment of FIG. 2) while in other embodiments, the number of clock signals may differ from the number of signal paths.

It should be appreciated that while in the illustrative embodiment of FIG. 2 the second clock signal 206 is an inversion of the first clock signal 204 (i.e. out of phase by 180°), in other embodiments synchronizer 200 is configured to receive a first clock signal 204 and a second clock signal 206 where the second clock signal 206 is out of phase with the first clock signal 204 by some number of degrees other than 180°.

Flip-flops 208, 210, 212, and 222 on the first signal path are clocked on the first clock signal 204, i.e. they are triggered on an edge of the first clock signal 204. While in the illustrative embodiment of FIG. 2 flip-flops 208, 210, 212, and 222 are triggered on a rising edge of the first clock signal 204, in other embodiments flip-flops 208, 210, 212, and 222 are triggered on a falling edge of the first clock signal 204.

Flip-flops 208 and 210 are arranged on the first signal path of synchronizer 200 to form a dual-rank synchronizer to decrease the probability of the output of flip-flop 210 (also referred to herein an "A1") from entering into a metastable state when asynchronous input 202 is provided along the first signal path. In other embodiments, different numbers of flip-flops in different configurations may be used to prevent the flip-flops on the first signal path from falling into a metastable state.

The output of flip-flop 210 (also referred to herein as "A1") is provided to compare logic 220 and flip-flop 212. The output of flip-flop 210 comprises asynchronous input 202 after both flip-flops 208 and 210 have triggered according to the first clock signal 204, i.e. asynchronous input 202 after two cycles of the first clock signal 204. The output of flip-flop 212 (also referred to herein as "A2") is provided to flip-flop 222 and compare logic 220. The output of flip-flop 212 comprises asynchronous signal 202 after flip-flops 208, 210, and 212 have triggered, i.e. asynchronous input 202 after three clock cycles of the first clock signal 204. Further, the output of flip-flop 222 (also referred to herein as "A3") is provided to a multiplexer 226, with the output of flip-flop 222 comprising asynchronous input 202 after flip-flops 208, 210, 212, and 222 have triggered, i.e. asynchronous input 202 after four cycles of the first clock signal 204.

Flip-flops 214, 216, 218, and 224 on the second signal path are clocked on the second clock signal 206, i.e. they are triggered on an edge of the second clock signal 206. While in the illustrative embodiment of FIG. 2 flip-flops 214, 216, 218, and 224 are triggered on a rising edge of the second clock signal 206, in other embodiments flip-flops 214, 216, 218, and 224 are triggered on a falling edge of the second clock signal 206.

Flip-flops 214 and 216 are arranged on the second signal path of synchronizer 200 to form a dual-rank synchronizer to decrease the probability of the output of flip-flop 216 from entering a metastable state when asynchronous input 202 is provided to the second signal path. In other embodiments, different numbers of flip-flops in different configurations may be used to prevent the flip-flops on the second signal path from falling into a metastable state.

The output of flip-flop 218 (also referred to herein as "B2") is provided to compare logic 220 and flip-flop 224.

The output of flip-flop 218 comprises asynchronous input 202 after flip-flops 214, 216, and 218 have triggered, i.e. asynchronous input 202 after three clock cycles of the second clock signal 206. The output of flip-flop 224 (also referred to herein as "B3") is provided to multiplexer 226. The output of flip-flop 224 comprises asynchronous input 202 after flop-flops 214, 216, 218, and 224 have triggered, that is to say, asynchronous input 202 after four cycles of the second clock signal 206.

Compare logic 220 comprises analog or digital logic gates, a processor, a microprocessor, a computer, or any combination thereof—to name a few examples—configured to generate a selector value according to values of asynchronous input 202 on the second signal path when falling and rising edges of asynchronous input 202 have been detected along the first signal path, as discussed in further detail with reference to FIGS. 3, 4A-4D, and 5. The selector value is provided to multiplexer 226 and comprises a selection of the value of asynchronous input 202 along the first path at the output of flip-flop 222 (A3) or the value of the asynchronous input 202 along the second path at the output of flip-flop 224 (B3). Multiplexer 226 is configured to select the value of asynchronous input 202 along the first path at A3 or along the second path at B3 according to the selector value provided by compare logic 220. The output of multiplexer 226 comprises synchronous output 228 which is synchronized according to the first clock signal 204. In the illustrative embodiment of FIG. 2, a synchronous output 228 is synchronized with the first clock signal 204, with the second clock signal 206 being an inverse of the first.

By selecting between values of asynchronous input 202 on the first signal path or the second signal path, jitter in synchronous output 228 is reduced. Jitter can refer to an undesirable variation in the periodicity of an asynchronous signal. For example, where the asynchronous signal 202 is provided by the detector output signal (i.e. comparator output signal) of FIG. 1, variations in the frequency of transitions of the comparator output signal can be attributable to factors other than the actual features or movement of the target and as a result adversely affect the accuracy with which the detector output signal reflects the actual speed and/or position of the target.

Figure 3:
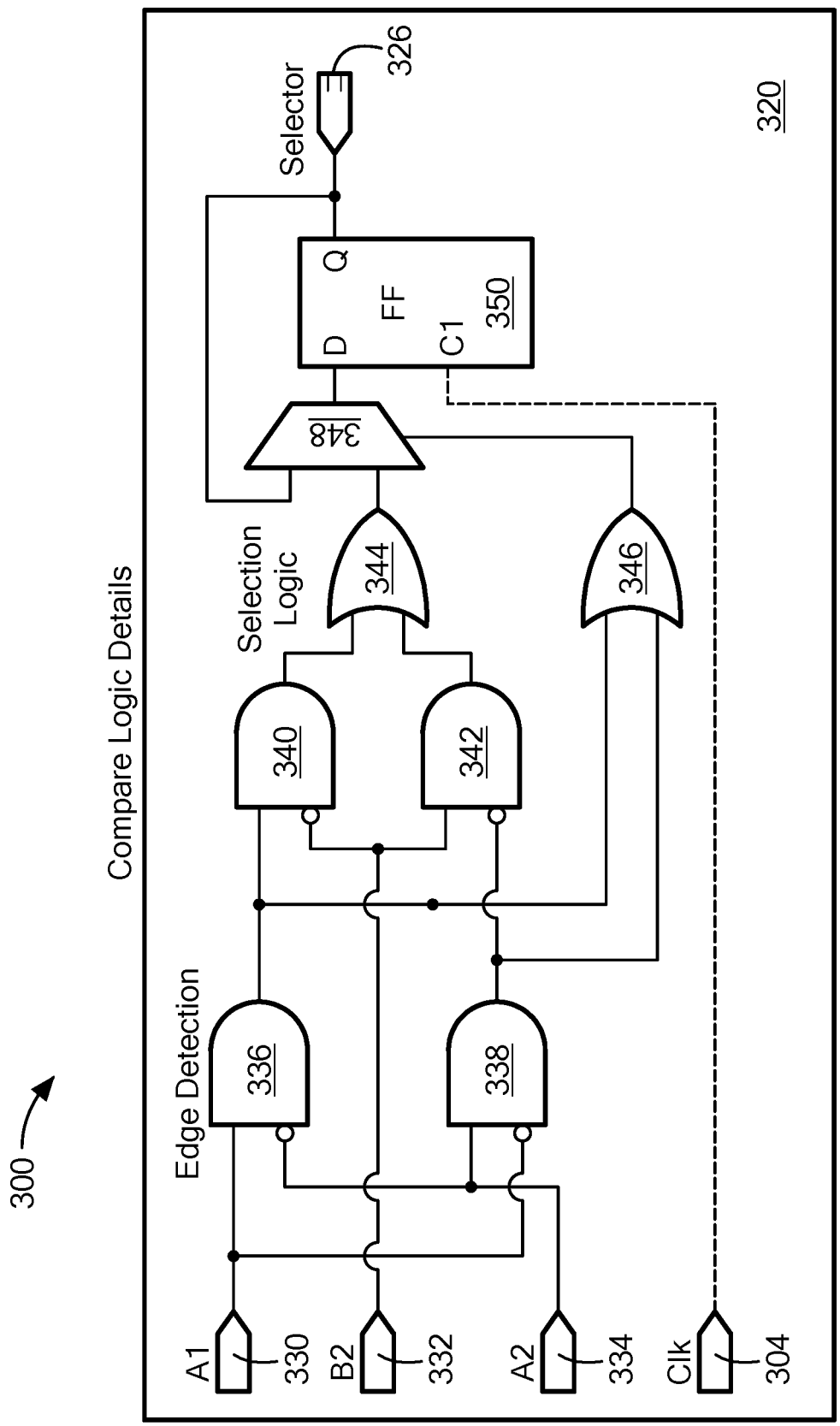
FIG. 3 is a block diagram of example compare logic, in some embodiments.

FIG. 3 illustrates example compare logic 320, in some embodiments. According to some embodiments, compare logic 320 may comprise compare logic 220 in the illustrative embodiment of FIG. 2. Compare logic 320 comprises a plurality of analog or digital logic gates configured to generate a selector signal 326. As discussed above, the selector signal 326 comprises a selection of a value of asynchronous input 202 along the first path at A3 or along the second path at B3. While in the illustrative embodiment of FIG. 3, compare logic 320 comprises AND gates 336-342 and OR gates 344 and 346, in other embodiments different numbers of different logic gate types may be used.

As discussed above with reference to FIG. 2, compare logic 320 receives a value of asynchronous input 202 at the output of flip-flop 210 (A1), a value of asynchronous input 202 at the output of flip-flop 212 (A2), and a value of asynchronous input 202 at the output of flip-flop 218 (B2). In the illustrative embodiment of FIG. 3, AND gates 336 and 338 detect rising and falling edges of the asynchronous input along the first signal path. AND gate 336 detects a rising edge of asynchronous input 202 along the first path by comparing the value of asynchronous input 202 at A1 to the value of asynchronous input 202 at A2. A first input of AND gate 336 is configured to receive A1 and a second input of AND gate 336 is configured to receive the inverse of A2 in order to detect if a rising edge has occurred. If AND gate 336 has determined that a rising edge has occurred (i.e. that asynchronous input 202 is high at A1 and low at A2) then AND gate 336 will output high, or TRUE. For example, when a rising edge has occurred (i.e. A1 is high and A2 is low), AND gate 336 would output high, or TRUE, because the first input of AND gate 336 would be high (A1 is high) and the second input would also be high (the inverse of A2 is high).

Also, in the illustrative embodiment of FIG. 3, AND gate 338 detects a falling edge of asynchronous input 202 by values of asynchronous input 202 at A1 and A2. A first input of AND gate 338 is configured to receive the inverse of A1 and a second input of AND gate 338 is configured to receive A2 in order to detect if a falling edge has occurred. If AND gate 338 has determined that a falling edge has occurred (i.e. asynchronous signal is low at A1 and high at A2) then AND gate 338 will output high, or TRUE. For example, when a falling edge has occurred (i.e. A1 is low and A2 is high), AND gate 338 would output high, or TRUE, because the first input of AND gate 338 would be high (the inverse of A1 is high) and the second input would be high (A2 is high).

Compare logic 320 further includes selection logic to determine whether the value of asynchronous input 202 from the first signal path or the second signal path should be selected for output by multiplexer 226. While in the illustrative embodiment of FIG. 3 the selection logic comprises AND gates 340-342 and OR gates 344-346, in other embodiments a different number of logic gates may be used in different configurations. The selection logic is configured to determine whether the value of asynchronous input 202 from the first signal path or the second signal path should be output based upon whether a change in asynchronous input 202 first occurred on the second signal path at B2 before the detected rising or falling edge on the first signal path. In other words, the selection logic is configured to determine whether the value of asynchronous input 202 from the first or second signal paths should be provided as an output based upon whether a change in asynchronous input 202 occurred closest to an edge of a clock (such as, for example, first clock signal 204) on the first or second signal paths. As discussed above, in reference to FIG. 2, the flip-flops of the first and second signal paths may be triggered according to either the rising or falling edge of first clock signal 204 or second clock signal 206, respectively. Therefore, according to some embodiments, the selection logic may make a selection based upon whether a change in asynchronous input 202 occurred closest to a rising edge of a clock signal on the first or second signal paths, and in other embodiments based upon whether a change in asynchronous input 202 occurred closest to a falling edge of a clock on the first or second signal paths.

In the illustrative embodiment of FIG. 3, AND gates 340 and 342 determine whether an edge was detected on the first signal path before a change in asynchronous input 202 occurred on the second signal path at B2 332. AND gate 340 detects whether a rising edge was detected on the first signal path between A1 330 and A2 334 before a change in asynchronous input 202 occurred on the second signal path. A first input of AND gate 340 is configured to receive the output of AND gate 336 and a second input of AND gate 340 is configured to receive the inverse of B2 332 in order to determine whether a rising edge was detected on the first signal path between A1 330 and A2 334 before a change in asynchronous input 202 occurred along the second signal path. If AND gate 340 determines that an edge was detected on the first signal path before a change in asynchronous input 202 occurred on the second signal path at B2 332, then AND gate 340 will output high, or TRUE.

For example, the value of asynchronous input 202 along the second signal path at B2 332 may be low when a rising edge is detected by AND gate 336. In this case, AND gate 340 would output high, or TRUE, as the first input of AND gate 336 would be high (AND gate 336 would output high as a rising edge was detected) and the second input of AND gate 336 would be high (the inverse of B2 332 is high in this example).

AND gate 342 determines whether a falling edge was detected on the first signal path between A1 330 and A2 334 before a change in asynchronous input 202 occurred on the second signal path. A first input of AND gate 342 is configured to receive the output of AND gate 338 and a second input of AND gate 342 is configured to receive B2 332 in order to determine whether a falling edge was detected on the first signal path before a change in asynchronous input 202 occurred on the second signal path. If AND gate 342 determines that a rising edge was detected on the first signal path before a change in asynchronous input 202 occurred on the second signal path, then AND gate 342 will output high, or TRUE.

For example, the value of asynchronous input 202 along the second signal path may be high when a falling edge is detected by AND gate 338. In this case, AND gate 342 would output high, or TRUE, as the first input of AND gate 342 would be high (AND gate 338 would output high as a falling edge was detected) and the second input would be high (as B2 334 is high).

OR gate 344 of the selection logic determines whether a detected edge occurred before there was a change in asynchronous input 202 along the second signal path before, in other words, OR gate 344 detects whether AND gate 340 or AND gate 342 determined that an edge was detected before there was a change in asynchronous input 202 on the second signal path. A first input of OR gate 344 is configured to receive the output of AND gate 340 and a second input of OR gate 344 is configured to receive the output of AND gate 342. If either AND gate 340 or 342 determined that an edge was detected before a change in asynchronous input 202 on the second signal path, OR gate 344 will output high, or TRUE. Likewise, if neither AND gate 340 nor 342 determined that an edge was detected before a change in asynchronous input 202 on the second signal path, OR gate 344 will output low, or FALSE.

OR gate 346 of the selection logic determines whether there was a rising or falling edge detected in asynchronous input 202 on the first signal path between A1 330 and A2 334, in other words, OR gate 346 detects whether AND gate 336 or AND gate 338 determined that an edge occurred. A first input of OR gate 346 is configured to receive the output of AND gate 336 and a second input of OR gate 346 is configured to receive the output of AND gate 338. If either AND gate 336 or 338 determined that an edge occurred along the first signal path, OR gate 346 will output high, or TRUE. Likewise, if neither AND gate 336 nor 338 determined that an edge occurred along the first signal path, OR gate 346 will output low, or FALSE.

Compare logic 320 further includes multiplexer 348 that outputs a selector value based on whether an edge along the first signal path was detected and whether a detected edge along the first signal path occurred before a change in asynchronous input 202 along the second signal path. In other words, whether a change in asynchronous input 202 occurred closest to an edge of a clock on the first or second signal paths. The selector value comprises an indication of what value is to be selected for output by multiplexer 226. For example, the selector value may comprise an indication that either A3 or B3 is to be selected for output by multiplexer 226. In compare logic 320, multiplexer 348 is configured to receive the output of OR gate 344 (determining whether there was a detected edge occurred before a change in asynchronous input 202 along the second signal path) and the output of OR gate 346 (determining whether there was a rising or falling edge detected in asynchronous input 202 on the first signal path). Based upon these values, multiplexer 348 outputs a selector value indicating whether A3 or B3 is to be selected for output as discussed further below with reference to FIG. 5.

The output of multiplexer 348 is provided to flip-flop 350. Flip-flop 350 is configured to synchronize the selector value with the first clock value 304 to generate a synchronized selector signal 326. Flip-flop 350 synchronizes the selector value as it is clocked according to the first clock signal 304 (i.e. flip-flop 350 is triggered by the first clock signal 304). Once flip-flop 350 is triggered, it outputs the synchronized selector value 326 based upon the selector value provided by multiplexer 348.

According to an embodiment, synchronized selector value 326 may further be provided to multiplexer 348. multiplexer 348 may further be configured to output a selector signal based upon the synchronized selector value 326. For example, multiplexer 348 may be configured to not output a new selector value until an edge along the first signal path has been detected.

FIGS. 4A-D illustrate example embodiments of the synchronous output 228, according to some embodiments.

Figure 4A:
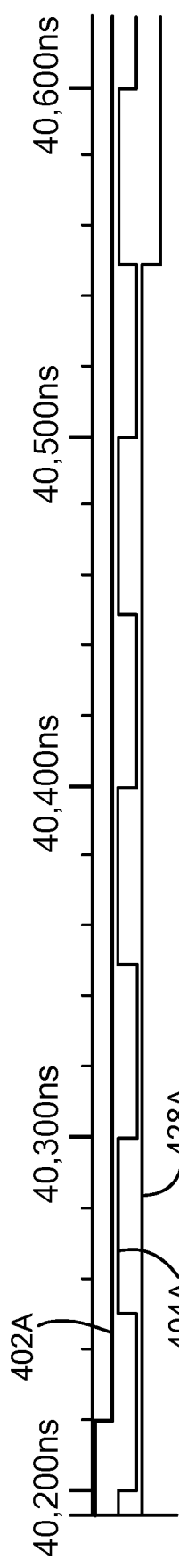
FIGS. 4A-D illustrate example embodiments of a synchronous output, according to some embodiments.

FIG. 4A illustrates a falling edge of an asynchronous input 402A synchronized to the rising edge of a clock 404A to generate synchronized output 428A. According to some embodiments, clock 404A may be, for example, first clock signal 304. In the illustrative embodiment of FIG. 4A, a falling edge of asynchronous input 402A occurs between two clock pulses. This falling edge of the asynchronous input 402A is reflected in synchronous output 428A as synchronous output 428A goes from high to low on the fourth rising edge of clock 404A after the falling edge of the asynchronous input 402A occurred. As discussed above, the flip-flops of system 100 may be configured to trigger on the rising or falling edge of a clock. In the illustrative embodiment of FIG. 4A, the flip-flops of the system are configured to trigger on the rising edge of a clock, causing the synchronized output 428A to reflect the falling edge of the asynchronous input 402A on the rising edge of a clock pulse. Further, as discussed above, each signal path may comprise any number of flip-flops for the purposes of preventing metastability. In the illustrative embodiment of FIG. 4A, there are four flip-flops on each signal path (such as flip-flops 208-212 and 222 on the first signal path and flip-flops 214-218 and 224 on the second signal path), causing the synchronized output 428A to reflect the falling edge of the asynchronous input 402A after 4 rising edges of clock 404A. Therefore, synchronized output 428A is synchronized according to changes in asynchronous input 402A occurring closest to the rising edges of clock 404A.

Figure 4B:
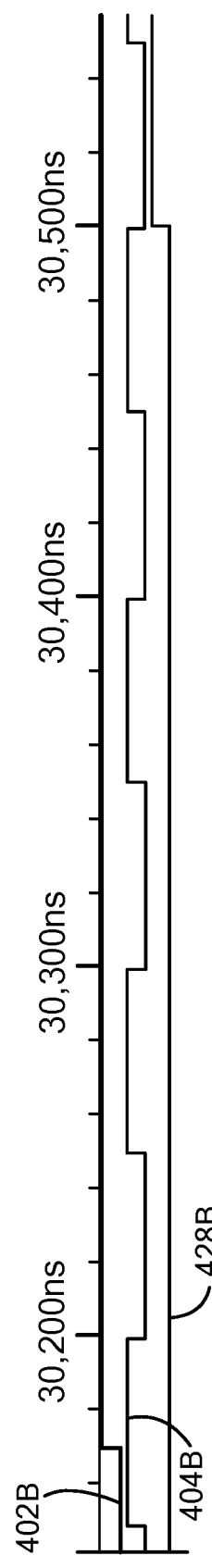

FIG. 4B illustrates a rising edge of the asynchronous input 402B synchronized to the falling edge of clock 404B to generate synchronized output 428B. In the illustrative embodiment of FIG. 4B, a rising edge of asynchronous input 402B occurs during a clock pulse. This rising edge of the asynchronous input 402B is reflected in synchronous output 428B as synchronous output 428B goes from low to high on the fourth falling edge of clock 404B after the rising edge of asynchronous input 402B occurred. In the illustrative embodiment of FIG. 4B, there are four flip-flops on each signal path configured to trigger on a falling edge of clock 404B. Therefore, synchronized output 428B is synchronized according to changes in asynchronous input 402B occurring closest to the falling edges of clock 404B.

Figure 4C:
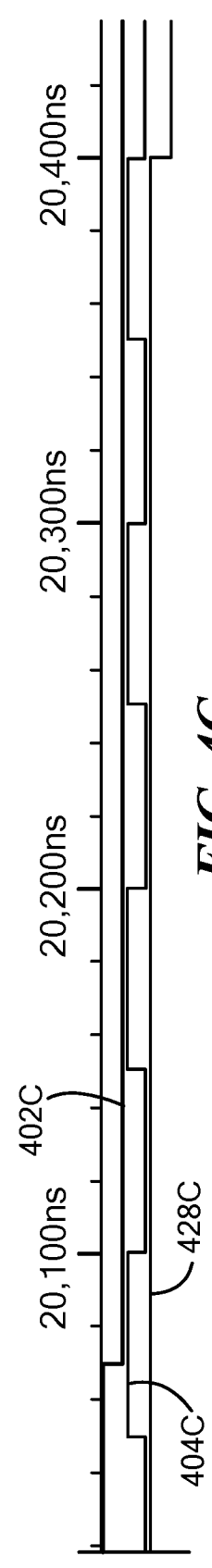

FIG. 4C illustrates a falling edge of the asynchronous input 402C synchronized to the falling edge of clock 404C to generate synchronous output 428C. In the illustrative embodiment of FIG. 4C, a falling edge of asynchronous input 402C occurs during a clock pulse. This falling edge of the asynchronous input 402C is reflected in synchronous output 428C as synchronous output 428C goes from high to low on the fourth falling edge of clock 404C after the falling edge of asynchronous input 402C occurred. In the illustrative embodiment of FIG. 4C, there are four flip-flops on each signal path configured to trigger on a falling edge of clock 404C. Therefore, synchronized output 428C is synchronized according to changes in asynchronous input 402C occurring closest to the falling edges of clock 404C.

Figure 4D:
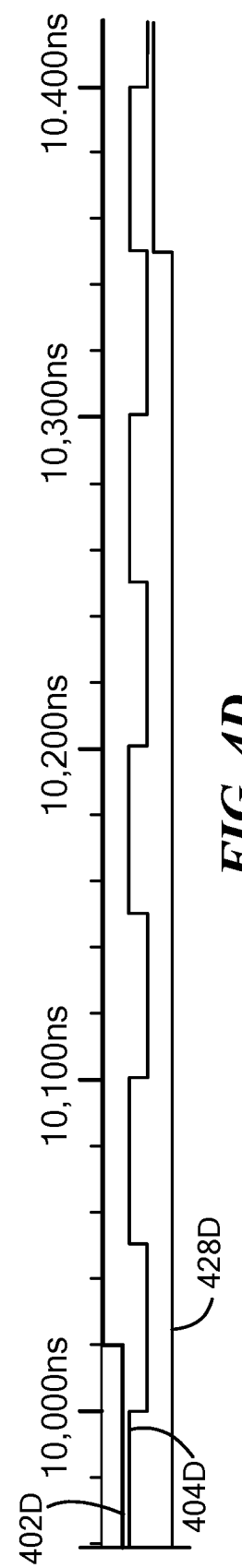

FIG. 4D illustrates a rising edge of the asynchronous input 402D synchronized to the rising edge of clock 404D to generate synchronous output 428D. In the illustrative embodiment of FIG. 4D, a rising edge of asynchronous input 402 occurs between two clock pulses. This rising edge of the asynchronous input 402D is reflected in synchronous output 428D as synchronous output 428B goes from low to high on the fourth rising edge of clock 404D after the rising edge of asynchronous input 402D occurred. In the illustrative embodiment of FIG. 4D, there are four flip-flops on each signal path configured to trigger on a rising edge of clock 404D. Therefore, synchronized output 428D is synchronized according to changes in asynchronous input 402D occurring closest to the rising edges of clock 404D.

Figure 5:
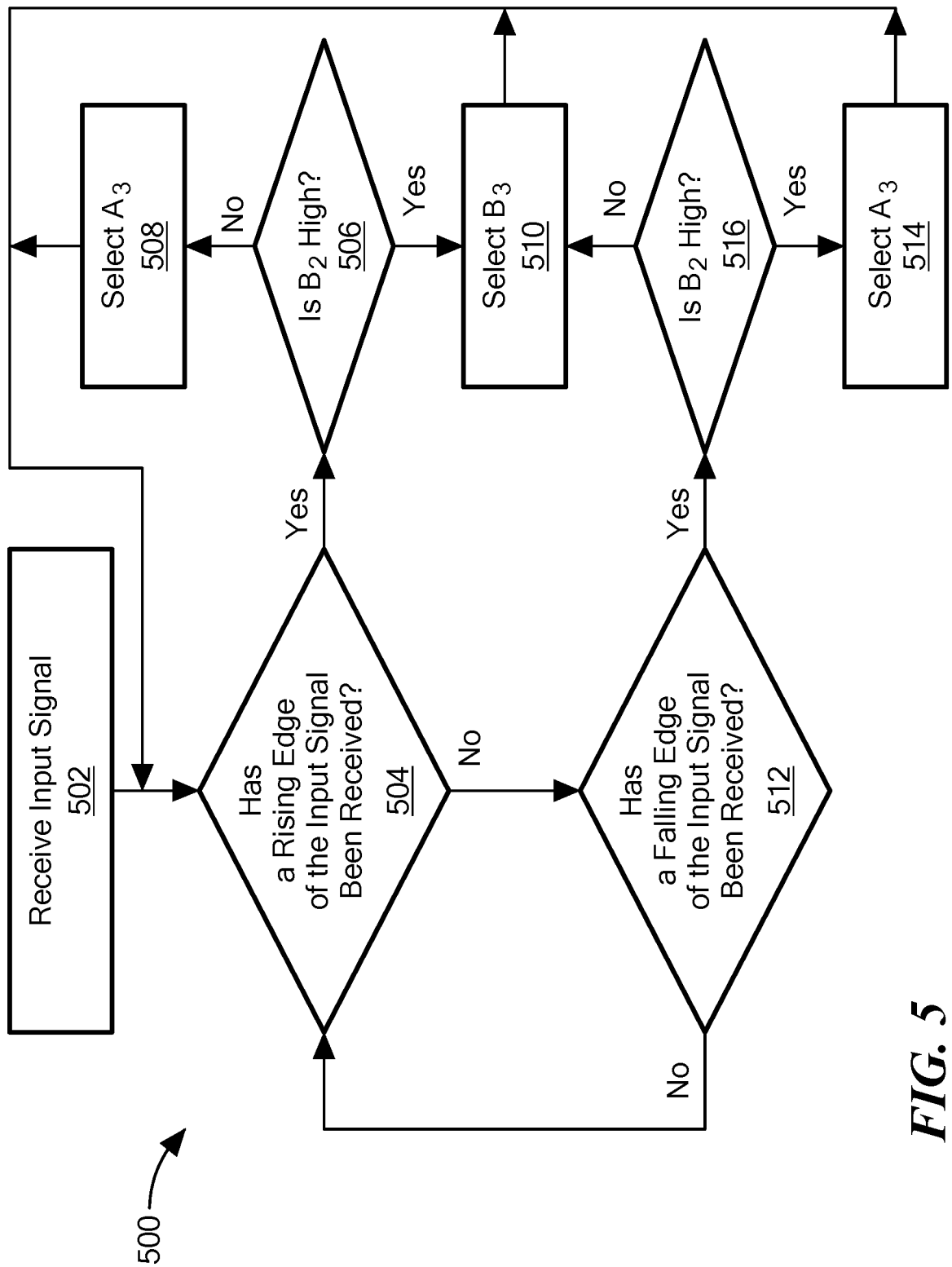
FIG. 5 is a flow diagram illustrating selection of an asynchronous input value from a signal path, according to some embodiments.

FIG. 5 illustrates a flow diagram for the selection of an asynchronous input value from a signal path, according to some embodiments. As discussed above in reference to FIGS. 2 and 3, multiplexer 226 may receive a selector value from compare logic 220 indicating whether A3 on the first signal path or B3 on the second signal path should be selected for output. Further, as discussed above in reference to FIG. 3, compare logic 320 outputs a synchronized selector value 326 based upon whether an edge of asynchronous input 202 was detected on the first signal path and whether there was a change in the asynchronous input along the second signal path before the edge was detected.

At block 502, both the first and second signal paths receive asynchronous input 202. At block 504, compare logic 220 determines whether a rising edge of asynchronous input 202 occurred between A1 and A2 on the first signal path. The logic to determine whether a rising edge occurred is discussed above in detail with reference to FIG. 3. If a rising edge has been detected then the system moves to block 506, otherwise the system moves to block 512.

At block 506, compare logic 220 determines whether there was a change in asynchronous input 202 along the second signal path at B2 before the rising edge was detected. This is performed by determining whether asynchronous input 202 was high along the second signal path at B2. If asynchronous input 202 is high at B2 the system moves on to block 510, otherwise the system moves on to block 508.

At block 512, compare logic 220 determines whether a falling edge of asynchronous input 202 occurred between A1 and A2 on the first signal path. The logic to determine whether a falling edge occurred is discussed above in detail with reference to FIG. 3. If no falling edge has been detected then block 504 is repeated, otherwise the system moves on to block 516.

At block 516, compare logic 220 determines whether there was a change in asynchronous input 202 along the second signal path at B2 before the falling edge was detected. This is performed by determining whether asynchronous input 202 was high along the second signal path at B2. If asynchronous input 202 is high at B2 the system moves to block 514, otherwise the system moves to block 510.

At block 508, compare logic 220 has determined that a rising edge of asynchronous input 202 was detected along the first signal path between A1 and A2 and that there was no change in asynchronous input 202 along the second signal path at B2 before the rising edge was detected. Because of this, multiplexer 226 selects the value of asynchronous input 202 along the first signal path at A3 to be output. The system then repeats block 504.

At block 510, compare logic 220 has determined either that a rising or falling edge of asynchronous input 202 was detected along the first signal path and a change in asynchronous input 202 along the second signal path at B2 before the edge was detected. Because of this, multiplexer 226 selects the value of asynchronous input 202 along the second signal path at B3 to be output. The system then repeats block 504.

At block 514, compare logic 220 has determined that a falling edge of asynchronous input 202 was detected along the first signal path between A1 and A2 and that there was no change in asynchronous input 202 along the second signal path at B2 before the falling edge was detected. Because of this, multiplexer 226 selects the value of asynchronous input 202 along the first signal path at A3 to be output. The system then repeats block 504.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

The invention claimed is:

1. A method for synchronization of an input signal, comprising:
   providing the input signal to a first signal path associated with a first clock, and to a second signal path associated with a second clock, wherein the second clock is out of phase with respect to the first clock;
   detecting an edge of the input signal by detecting values of the input signal along the first signal path at a first active edge of the first clock and at a second active edge of the first clock;
   detecting a value of the input signal along the second signal path at a first active edge of the second clock; and
   selecting the input signal from the first signal path or from the second signal path according to the detected value of the input signal along the second path when an active edge of the input signal along the first path is detected.

2. The method of claim 1, further comprising:
   providing the selected one of the input signal from the first signal path or from the second signal path as an output signal synchronized with a closest following one of a rising edge or a falling edge of the first clock.

3. The method of claim 1, wherein the second clock is an inverted version of the first clock.

4. The method of claim 1, wherein detecting values of the input signal occurs at a predetermined time after providing the input signal to the first and second signal paths, wherein the predetermined time is associated with at least one cycle of the first clock or the second clock.

5. The method of claim 1, wherein selecting the input signal from the first signal path or from the second signal path occurs at a predetermined time after detecting values of the input signal, wherein the predetermined time is associated with at least one cycle of the first clock or the second clock.

6. The method of claim 1, wherein selecting the input signal from the first signal path or from the second signal path comprises:
   determining whether a rising edge of the input signal has been received.

7. The method of claim 6, wherein selecting the input signal from the first signal path or from the second signal path further comprises:
selecting the input signal from the second signal path if the detected value of the input signal along the second signal path is high when the rising edge of the input signal is received.

8. The method of claim 6, wherein selecting the input signal from the first signal path or from the second signal path further comprises:
selecting the input signal from the first signal path if the detected value of the input signal along the second signal path is set low when the rising edge of the input is received.

9. The method of claim 1, wherein selecting the input signal from the first signal path or from the second signal path comprises:
determining whether a falling edge of the input signal has been received.

10. The method of claim 9, wherein selecting the input signal from the first signal path or from the second signal path further comprises:
selecting the input signal from the first signal path if the detected value of the input signal along the second signal path is high when the falling edge of the input signal is received.

11. The method of claim 9, wherein selecting the input signal from the first signal path or from the second signal path further comprises:
selecting the input signal from the second signal path if the detected value of the input signal along the second signal path is low when the falling edge of the input signal is received.

12. The method of claim 1, wherein the input signal comprises an output signal of at least one or more of a magnetic field sensor, a pressure sensor, a temperature sensor, or a photo-electric sensor.

13. Apparatus for synchronization of an asynchronous signal in a sensor, comprising:
a sensing element for generating a sensed signal;
a detector responsive to the sensed signal and configured to generate an asynchronous detector output signal; and
a synchronizer responsive to the asynchronous detector output signal and configured to synchronize the asynchronous detector output signal to a selected one of a first edge of the at least one clock and a second edge of the at least one clock;
wherein the at least one clock comprises a first clock and a second clock and wherein the synchronizer comprises:
a first signal path coupled to receive the asynchronous detector output signal and associated with the first clock;
a second signal path coupled to receive the asynchronous detector output signal and associated with the second clock;
a comparator coupled to the first signal path and to the second signal path and configured to compare values of the detector output signal along the first signal path at a first active edge of the first clock and at a second rising edge of the first clock and along the second signal path at an active edge of the second clock; and
a multiplexer coupled to an output of the comparator and configured to select the asynchronous detector output signal from the first signal path or from the second signal path according to the comparison by the comparator of the values of the detector output signal along the first and second signal paths.

14. The apparatus of claim 13, wherein the second clock is out of phase with respect to the first clock.

15. The apparatus of claim 13, wherein the second clock is an inverted version of the first clock.

16. The apparatus of claim 13, wherein the multiplexer is further configured to:
provide the selected one of the input signal from the first signal path or the second signal path as an output signal of the sensor.

17. The apparatus of claim 13:
wherein the first signal path comprises a plurality of flip-flops, at least two of the plurality of flip-flops arranged in a dual-rank synchronizer; and
wherein the second signal path comprises a plurality of flip-flops, at least two of the plurality of flip-flops arranged in a dual-rank synchronizer.

18. The apparatus of claim 13, wherein the sensing element comprises a magnetic field sensing element responsive to a magnetic field affected by movement of a target and wherein the sensed signal is indicative of movement of the target.

19. The apparatus of claim 18, wherein the transitions of the asynchronous detector output signal are indicative of a rotation of the target.

20. The apparatus of claim 18, further comprising a back-bias magnet to generate the magnetic field, wherein the target comprises a ferromagnetic object.

21. The apparatus of claim 18, wherein the magnetic field sensing element comprises at least one of a Hall effect element or a magnetoresistance element.

22. Apparatus for synchronization of an asynchronous signal, comprising:
means for comparing values of the asynchronous signal along a first signal path associated with a first clock and along a second signal path associated with a second clock, wherein the second clock is out of phase with respect to the first clock; and
means for selecting the detector output signal from the first signal path or from the second signal path according to a comparison of the values of the detector output signal along the first and second signal paths.

23. The apparatus of claim 22, further comprising:
means for providing the selected one of the input signal from the first signal path or the from the second signal path as an output signal synchronized with a closest one of a rising edge or a falling edge of the first clock.

* * * * *

UNITED STATES PATENT AND TRADEMARK OFFICE
CERTIFICATE OF CORRECTION

PATENT NO. : 10,797,851 B2  
APPLICATION NO. : 15/966572  
DATED : October 6, 2020  
INVENTOR(S) : Jay Towne et al.

It is certified that error appears in the above-identified patent and that said Letters Patent is hereby corrected as shown below:

In the Specification

Column 5, Line 19 delete "pair," and replace with --pairs--.

Column 5, Line 43 delete "material" and replace with --material)--.

Column 5, Line 47 delete "produced a" and replace with --produced by a--.

Column 6, Line 38 delete "provide" and replace with --provided--.

Column 7, Line 2 delete "comprises" and replace with --comprise--.

Column 7, Line 4 delete "degree." and replace with --degrees.--.

Column 11, Line 6 delete "edge occurred" and replace with --edge that occurred--.

Column 11, Line 24 delete "348. multiplexer" and replace with --348. Multiplexer--.

In the Claims

Column 16, Line 55 delete "or the from" and replace with --or from--.

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*